United States Patent
Jeong et al.

(10) Patent No.: US 10,312,156 B2
(45) Date of Patent: Jun. 4, 2019

(54) VERTICAL FIN FIELD EFFECT TRANSISTOR (V-FINFET), SEMICONDUCTOR DEVICE HAVING V-FINFET AND METHOD OF FABRICATING V-FINFET

(71) Applicant: SAMSUNG ELECTRONICS CO., LTD., Suwon-si, Gyeonggi-Do (KR)

(72) Inventors: Soo Yeon Jeong, Osan-si (KR); Myung Gil Kang, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/838,665

(22) Filed: Dec. 12, 2017

(65) Prior Publication Data

US 2018/0114731 A1 Apr. 26, 2018

Related U.S. Application Data

(62) Division of application No. 15/290,456, filed on Oct. 11, 2016, now Pat. No. 9,870,957.
(Continued)

(51) Int. Cl.
*H01L 29/66* (2006.01)
*H01L 21/8238* (2006.01)
(Continued)

(52) U.S. Cl.
CPC ........... *H01L 21/823821* (2013.01); *H01L 21/823828* (2013.01); *H01L 21/823885* (2013.01);
(Continued)

(58) Field of Classification Search
CPC ..... H01L 21/823821; H01L 21/823885; H01L 23/535; H01L 27/0924; H01L 29/0649; H01L 29/41791; H01L 29/4966; H01L 29/66553; H01L 29/66666; H01L 29/66795; H01L 29/7827; H01L 29/785
(Continued)

(56) References Cited

U.S. PATENT DOCUMENTS 7,682,885 B2  3/2010  Cho et al.
8,039,347 B2  10/2011  Shin et al.
(Continued)

OTHER PUBLICATIONS

Corresponding U.S. Appl. No. 15/290,456, filed Oct. 11, 2016.

*Primary Examiner* — Tu-Tu V Ho
(74) *Attorney, Agent, or Firm* — F. Chau & Associates, LLC

(57) ABSTRACT

A vertical fin field effect transistor (V-FinFET) is provided as follows. A substrate has a lower source/drain (S/D). A fin structure extends vertically from an upper surface of the lower S/D. The fin structure includes a sidewall having an upper sidewall portion, a lower sidewall portion and a center sidewall portion positioned therebetween. An upper S/D is disposed on an upper surface of the fin structure. An upper spacer is disposed on the upper sidewall portion. A lower spacer is disposed on the lower sidewall portion. A stacked structure including a gate oxide layer and a first gate electrode is disposed on an upper surface of the lower spacer, the center sidewall portion and a lower surface of the upper spacer. A second gate electrode is disposed on the first gate electrode.

7 Claims, 23 Drawing Sheets

Related U.S. Application Data

(60) Provisional application No. 62/351,010, filed on Jun. 16, 2016.

(51) Int. Cl.
*H01L 23/535* (2006.01)
*H01L 27/092* (2006.01)
*H01L 29/06* (2006.01)
*H01L 29/417* (2006.01)
*H01L 29/49* (2006.01)
*H01L 29/78* (2006.01)

(52) U.S. Cl.
CPC .......... *H01L 23/535* (2013.01); *H01L 27/092* (2013.01); *H01L 27/0924* (2013.01); *H01L 29/0649* (2013.01); *H01L 29/41791* (2013.01); *H01L 29/4966* (2013.01); *H01L 29/66553* (2013.01); *H01L 29/66666* (2013.01); *H01L 29/66795* (2013.01); *H01L 29/785* (2013.01); *H01L 29/7827* (2013.01)

(58) Field of Classification Search
USPC .......................................................... 257/331
See application file for complete search history.

(56) References Cited

U.S. PATENT DOCUMENTS

| | | |
|---|---|---|
| 8,859,363 B2 | 10/2014 | Kim et al. |
| 8,975,689 B1 | 3/2015 | Kim et al. |
| 9,196,655 B2 | 11/2015 | Park |
| 9,245,976 B2 | 1/2016 | Cho et al. |
| 9,525,064 B1 | 12/2016 | Balakrishnan et al. |
| 9,614,087 B1 | 4/2017 | Cheng et al. |
| 9,640,667 B1 | 5/2017 | Balakrishnan et al. |
| 2015/0243707 A1 | 8/2015 | Park |
| 2015/0372135 A1 | 12/2015 | Park |
| 2016/0064541 A1 | 3/2016 | Diaz et al. |
| 2017/0194318 A1* | 7/2017 | Balakrishnan .... H01L 29/66136 |

\* cited by examiner

VERTICAL FIN FIELD EFFECT TRANSISTOR (V-FINFET), SEMICONDUCTOR DEVICE HAVING V-FINFET AND METHOD OF FABRICATING V-FINFET

CROSS-REFERENCE TO RELATED APPLICATION

This application is a divisional application of U.S. patent application Ser. No. 15/290,456, filed on Oct. 11, 2016, which claims the benefit under 35 U.S.C. § 119(e) to U.S. Provisional Patent Application No. 62/351,010, filed on Jun. 16, 2016 in the United States Patent & Trademark Office, the disclosure of which is incorporated by reference herein in its entirety.

TECHNICAL FIELD

The present inventive concept relates to a vertical fin field effect transistor (V-FinFET), a semiconductor device having the V-FinFET and a method of fabricating the V-FinFET.

DISCUSSION OF RELATED ART

Transistors have been planar. As the transistors shrink, leakage current increases, draining batteries and heating up semiconductor chips. To reduce the leakage current, various transistor structures have been proposed.

SUMMARY

According to an exemplary embodiment of the present inventive concept, a vertical fin field effect transistor (V-FinFET) is provided as follows. A substrate has a lower source/drain (S/D). A fin structure extends vertically from an upper surface of the lower S/D. The fin structure includes a sidewall having an upper sidewall portion, a lower sidewall portion and a center sidewall portion positioned therebetween. An upper S/D is disposed on an upper surface of the fin structure. An upper spacer is disposed on the upper sidewall portion. A lower spacer is disposed on the lower sidewall portion. A stacked structure including a gate oxide layer and a first gate electrode is disposed on an upper surface of the lower spacer, the center sidewall portion and a lower surface of the upper spacer. A second gate electrode is disposed on the first gate electrode.

According to an exemplary embodiment of the present inventive concept, a semiconductor device is provided as follows. The semiconductor device includes a first vertical field effect transistor (V-FinFET). The first V-FinFET includes a substrate having a lower source/drain (S/D), a first fin structure disposed on art upper surface of the lower S/D. The first fin structure includes a sidewall having a lower sidewall portion, an upper sidewall portion and a center sidewall portion positioned therebetween. The first V-FinFET also includes an upper S/D disposed on an upper surface of the first fin structure, a lower spacer disposed on the lower sidewall portion and an upper spacer disposed on the upper sidewall portion. The upper spacer includes a first sidewall which is in contact with the upper sidewall portion and a second sidewall. The first V-FinFET also includes a stacked structure including a gate oxide layer and a first gate electrode. The stacked structure is interposed between the upper spacer and the lower spacer. A first sidewall of the stacked structure is in contact with the sidewall of the first fin structure. A second sidewall of the stacked structure is vertically aligned with the second sidewall of the upper spacer.

According to an exemplary embodiment of the present inventive concept, a method of fabricating a vertical fin field effect transistor (V-FinFET) is provided as follows. A lower S/D is formed in a substrate. A preliminary stacked structure is formed on the substrate. The preliminary stacked structure includes a preliminary lower spacer layer, a sacrificial layer and a preliminary upper spacer layer stacked on each other. A first trench penetrating the preliminary stacked structure is formed to expose the lower S/D. A fin structure is formed in the first trench and on the lower S/D. An upper S/D is formed on the fin structure and the preliminary stacked structure. The fin structure is epitaxially grown from the lower S/D.

BRIEF DESCRIPTION OF DRAWINGS

These and other features of the present inventive concept will become more apparent by describing in detail exemplary embodiments thereof with reference to the accompanying drawings of which.

Figure 1:
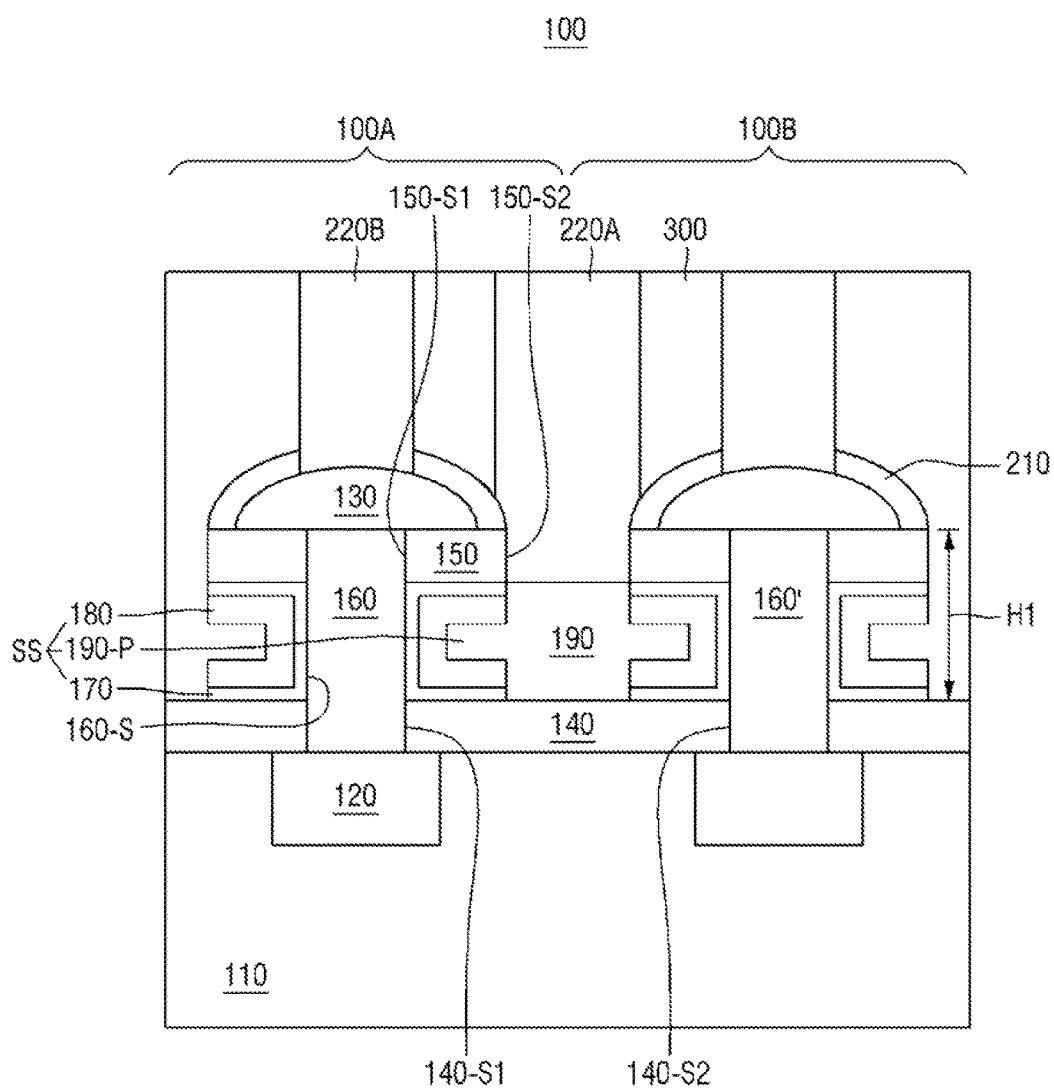
FIG. 1 shows a cross-sectional view of a semiconductor device including a vertical fin field effect transistor (V-FinFET) according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

FIG. 1 shows a cross-sectional view of a semiconductor device 100 including a first vertical fin field effect transistor (V-FinFET) 100A and a second V-FinFET 100E according to an exemplary embodiment of the present inventive concept. The first and second V-FinFETs 100A and 100B may be an N-type transistor or a P-type transistor. For example, the first and second V-FinFET 100A and 100B are of the same type semiconductor or different type semiconductors.

The first V-FinFET 100A is substantially similar to the second V-FinFET 100B, and thus for the convenience of descriptions, the first V-FinFET 100A will be described below and will be referred to as a V-FinFET 100A. The descriptions of the first V-FinFET 100A may be applicable to the second V-FinFET 100B. If the second V-FinFET 100B is a different type transistor, impurities doped into a source/drain will be different.

The V-FinFET 100A includes a fin structure 160, a lower source/drain (S/D) 120 and an upper S/D 130. The fin structure 160 is disposed on an upper surface of the lower S/D 120 and disposed under a lower surface of the upper S/D 130. For example, the fin structure 160, vertically extended from the upper surface of the lower S/D 120, is interposed between the lower S/D 120 and the upper S/D 130. In this case, a height H1 of the fin structure 160 is equivalent to the gate length of the V-FinFET 100A measured along a sidewall 160-S of the fin structure 160 between the upper S/D 130 and the lower S/D 120.

The lower S/D 120 is formed by doping impurities in a substrate 110 using an ion implantation process or a diffusion process. The substrate 110 may be formed of silicon (Si) or an alloy of silicon and germanium (SiGe). If the V-FinFET 100A is an N-type transistor, the impurities may be N-type impurities such as phosphorus (P), arsenic (As), or antimony (Sb). If the V-FinFET 100A is a P-type transistor, the impurities may be P-type impurities such as boron (B), aluminum (Al) or gallium (Ga).

The V-FinFET 100A may have a channel in the fin structure 160. For example, when the V-FinFET 100A turns on, the channel may be formed along the sidewall 160-S of the fin structure 160 and a transistor turn-on current may flows along the channel.

The V-FinFET 100A also includes a gate oxide layer 170, a first gate electrode 180, a lower spacer 140 and an upper spacer 150. The gate oxide layer 170 and the first gate electrode 180 are interposed between the upper spacer 150 and the lower spacer 140. For example, a stacked structure of the gate oxide layer 170 and the first gate electrode 180 is interposed between the upper spacer 150 and the lower spacer 140.

The upper spacer 150 and the lower spacer 140 are formed on the sidewall 160-S of the fin structure 160. The upper spacer 150 includes a first sidewall 150-S1 and a second sidewall 150-S2. The lower spacer 140 includes a first sidewall 140-S1 and a second sidewall 140-S2. The sidewall 160-S of the fin structure 160 includes an upper sidewall portion, a lower sidewall portion and a center sidewall portion positioned between the upper sidewall portion and the lower sidewall portion.

For example, the first sidewall 150-S1 of the upper spacer 150 is disposed on the upper sidewall portion of the fin structure 160. In an exemplary embodiment, the first sidewall 150-S1 of the upper spacer 150 may be in contact with the upper sidewall portion of the fin structure 160.

For example, the first sidewall 140-S1 of the lower spacer 140 is disposed on the lower sidewall portion of the fin structure 160. In an exemplary embodiment, the first sidewall 140-S1 of the lower spacer 140 may be in contact with the lower sidewall portion of the fin structure 160.

The lower spacer 140 is shared by the two adjacent first and second V-FinFETs 100A and 100B. In this case, the lower spacer 140 is also disposed on a sidewall of a fin structure 160' of the second V-FinFET 100I. In an exemplary embodiment, the second sidewall 140-S2 may be in contact with the sidewall of the fin structure 160' of the second V-FinFET 100B.

The upper spacer 150 may be formed of silicon nitride deposited using a chemical vapor deposition (CVD) process or a plasma enhanced CVD (PECVD) process. The upper spacer 150 and the lower spacer 140 may have substantially the same material including silicon nitride.

According to an exemplary embodiment, the fin structure 160 is formed within a preliminary stacked structure of a preliminary upper spacer layer, a sacrificial layer and a preliminary lower spacer layer and thus the gate length of the V-FinFET 100A may be determined by controlling a thickness of the preliminary stacked structure. The preliminary stacked structure may be described with respect to FIG. 4.

The gate oxide layer 170 is formed on a lower surface of the upper spacer 150 and an upper surface of the lower spacer 140. The gate oxide layer 170 is also formed on the center sidewall portion of the fin structure 160 exposed between the upper spacer 150 and the lower spacer 140. Accordingly, the gate oxide layer 170 is C-shaped.

The gate oxide layer 170 may be formed of a high-k dielectric material including $HfO_2$ or HfSiO. The gate oxide layer 170 may be formed using various deposition processes including chemical vapor deposition (CVD) process, a plasma enhanced CVD (PECVD) process, a metallorganic CVD (MOCVD) process or an atomic layer deposition process (ALD) process.

The first gate electrode 180 is disposed on the gate oxide layer 170. In this case, the gate oxide layer 170 is interposed between the first gate electrode 180 and the sidewall 160-S of the fin structure 160; the gate oxide layer 170 is interposed between the upper spacer 150 and the first gate electrode 180; and the gate oxide layer 170 is interposed between the lower spacer 140 and the first gate electrode 180. In this case, the first gate electrode 180 is conformity formed on the gate oxide layer 170 and is C-shaped.

Accordingly, a stacked structure SS of the gate oxide layer 170 and the first gate electrode 180 is interposed between the upper spacer 150 and the lower spacer 140 in a manner that a sidewall of the stacked structure SS of the gate oxide layer 170 and the first gate electrode 180 is in contact with the sidewall 160-S of the fin structure 160 and another sidewall of the stacked structure SS is vertically aligned with the second sidewall 150-S2 of the upper spacer 150.

Figure 1A:
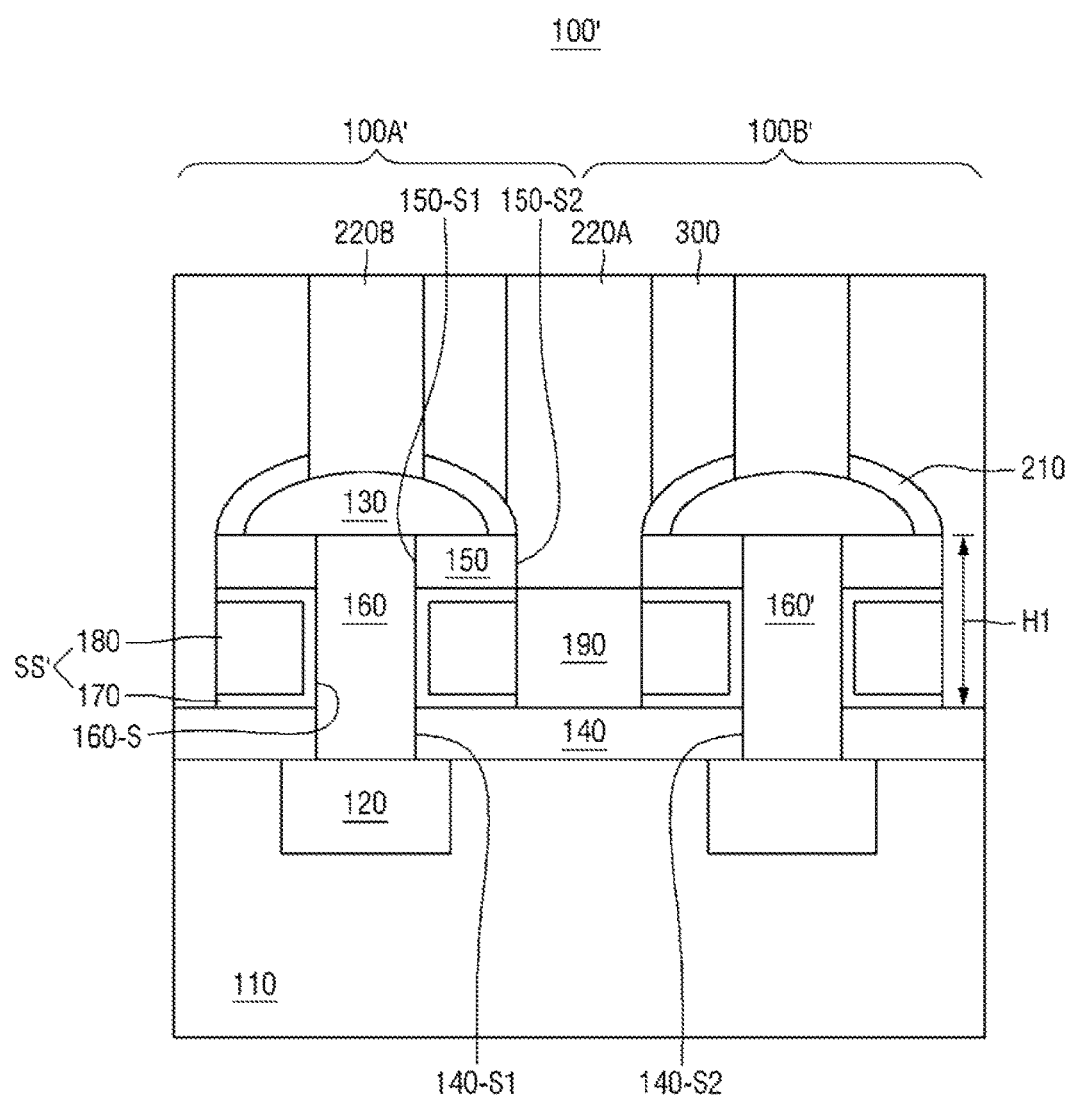
FIG. 1A shows a cross-sectional view of a semiconductor device including a vertical fin field effect transistor (V-FinFET) according to an exemplary embodiment of the present inventive concept.

In an exemplary embodiment, the first gate electrode 180 may completely fill the C-shaped gate oxide layer 170, as shown in FIG. 1A. The other elements of FIG. 1A are the same with their corresponding elements of FIG. 1, and thus for the convenience of descriptions, only differences between FIG. 1 and FIG. 1A will be described and further descriptions of the same elements will be omitted herein.

The first gate electrode 180 may be formed of nitride including TiN. The present inventive concept is not limited thereto. The first gate electrode 180 may be formed of at least two different material layers such as TiN/TaN/TiAlC.

The V-FinFET 100A includes a second gate electrode 190 disposed between two adjacent fin structures 160. When viewed from the above of the V-FinFET 100A, the second gate electrode 190 may surround the fin structures 160. The second gate electrode 190 has an upper surface which is coplanar with an interface between the gate oxide layer 170 and the upper spacer 150. The present inventive concept is not limited thereto. For example, the upper surface of the second gate electrode 190 may be higher or lower than the interface between the gate oxide layer 170 and the upper spacer 150. The second gate electrode 190 and the first gate electrode 180 are electrically connected to each other. For example, the second gate electrode 190 is in contact with the first gate electrode 180. Accordingly, the gate length of the V-FinFET 100A may be determined by the height H1 of the fin structure 160 which is capacitively coupled with the first gate electrode 180, irrespective of the positions of the upper surface of the second gate electrode 190.

The second gate electrode 190 is shared by two adjacent first and second V-FinFETs 100A and 100B.

The second gate electrode 190 fills a gap defined by the first gate electrode 180 between the upper spacer 150 and the lower spacer 140. For example, the C-shaped first gate electrode 180 receives a portion 190-P of the second gate electrode 190 so that the stacked structure SS of the gate oxide layer 170 and the first gate electrode 180 also includes the portion 190-P of the second gate electrode 190.

The stacked structure SS of the portion 190-P of the second gate electrode 190, the first gate electrode 180 and the gate oxide layer 170 is interposed between the upper spacer 150 and the lower spacer 140. For example, the stacked structure SS fills a space between the upper spacer 150 and the lower spacer 140. In this case, the portion 190-P of the second gate electrode 190 is protruded into the C-shaped first gate electrode 180.

In an exemplary embodiment of FIG. 1A, the second gate electrode 190 is not protruded into the C-shaped first gate electrode 180 so that a sidewall of the second gate electrode 190 is vertically aligned with the second sidewall 150-S2 of the upper spacer 150. A stacked structure SS' includes the gate oxide layer 170 and the first gate electrode 180. The stacked structure SS' is interposed between the upper spacer 150 and the lower spacer 140.

Referring back to FIG. 1, the lower spacer 140 interposed between the second gate electrode 190 and the lower S/D 120 may serve to prevent the second gate electrode 190 from being in electrical shortage with the lower S/D 120.

The upper spacer 150 interposed between the second gate electrode 190 and the upper S/D 130 may serve to prevent the second gate electrode 190 from being in electrical shortage with the upper S/D 130.

The semiconductor device 100 also includes an insulating layer 300, a capping layer 210 and contact electrodes having a gate contact electrode 220A and an upper S/D contact electrode 220B.

The gate contact electrode 220A penetrates the insulating layer 300 to be electrically connected to the second gate electrode 190. A first ohmic contact layer (not shown here) may be interposed between the second gate electrode 190 and the gate contact electrode 220A to reduce a contact resistance therebetween. In this case, the gate contact electrode 220A may be in contact with the first ohmic contact layer.

The upper S/D contact electrode 220B penetrates the insulating layer 300 and the capping layer 210 to be electrically connected to the upper S/D 130. A second ohmic contact layer (not shown here) may be interposed between the upper S/D 130 and the upper S/D contact electrode 220B.

Hereinafter, a method of fabricating the V-FinFET 100A will be described with reference to FIGS. 2 to 16.

Figure 2:
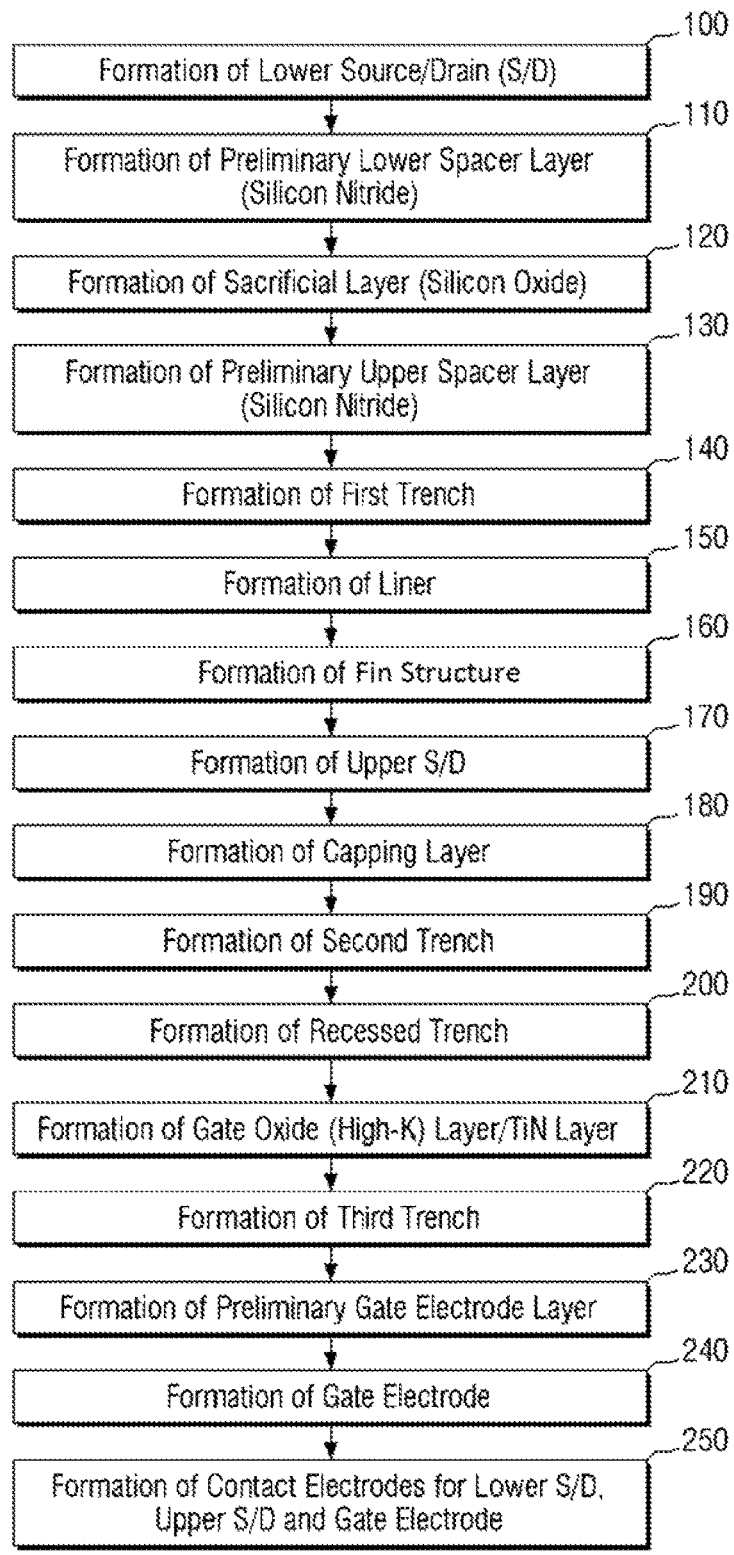
FIG. 2 shows a flowchart of fabricating the V-FinFET of FIG. 1 and the V-FinFET of FIG. 1A according to an exemplary embodiment of the present inventive concept.

FIG. 2 is a flowchart of fabricating the V-FinFET 100A of FIG. 1 according to an exemplary embodiment of the present inventive concept. FIGS. 3 to 16 show cross-sectional views of the V-FinFET 100A formed according to the flowchart of FIG. 2.

Figure 3:
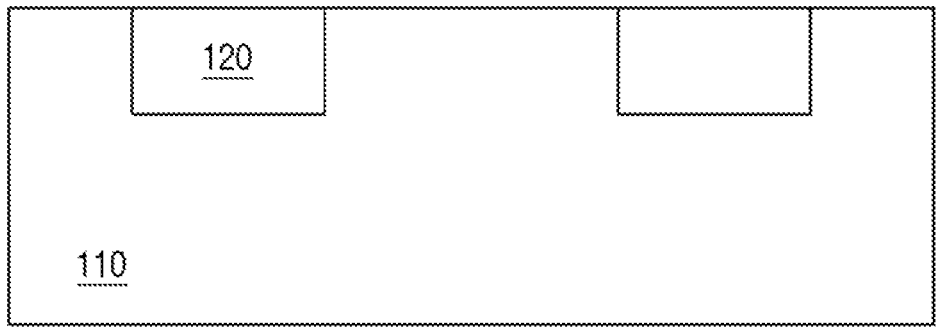
FIGS. 3 to 16 show cross-sectional views of the V-FinFET of FIG. 1 formed according to the flowchart of FIG. 2.

FIG. 3 shows a lower S/D 120 formed after step 100 of FIG. 2 is performed according to an exemplary embodiment of the present inventive concept.

In step 100, a doping process is performed to form the lower S/D 120 in a substrate 110 using an ion implantation process or a diffusion process. If an N-type transistor is formed, N-type impurities such as phosphorus (P), arsenic (As), or antimony (Sb) may be doped in the substrate 110. For a P-type transistor, P-type impurities such as boron (B), aluminum (Al) or gallium (Ga) may be doped in the substrate.

The substrate 110 may be formed of silicon (Si) or an alloy of silicon and germanium (SiGe).

Figure 4:
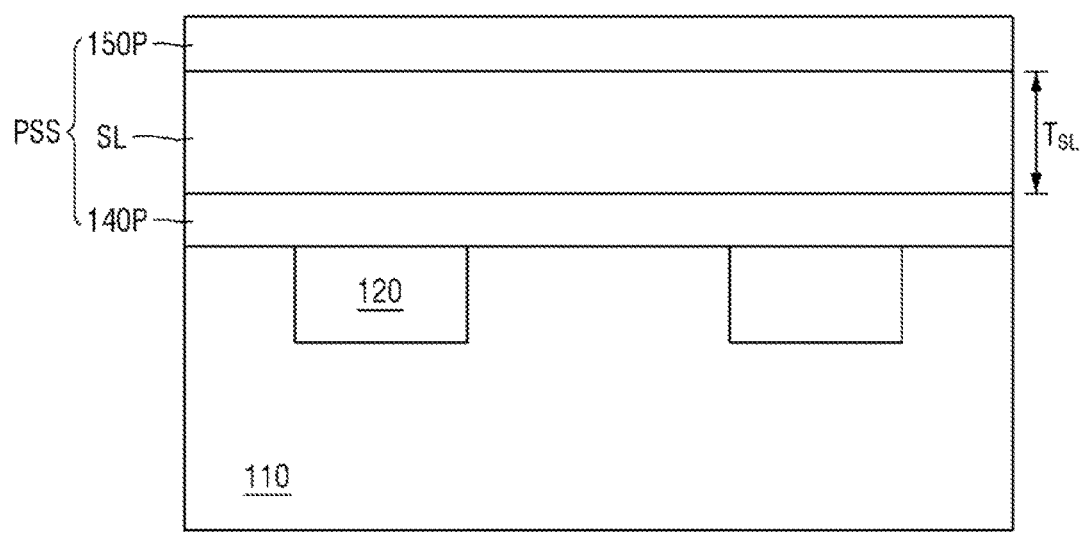

FIG. 4 shows a preliminary stacked structure PSS including a preliminary lower spacer layer 140P, a sacrificial layer SL and a preliminary upper spacer layer 150P according to steps 110, 120 and 130 of FIG. 2. In the preliminary stacked structure PSS, the preliminary lower spacer layer 140P, the sacrificial layer SL and the preliminary upper spacer layer 150P are stacked on each other in the listed order from the substrate 110. For example, the preliminary stacked structure PSS is formed on the substrate 110.

The preliminary lower spacer layer 140P may be formed of silicon nitride. The sacrificial layer SL may be formed of silicon or silicon oxide. The preliminary upper spacer layer 150I may be formed of silicon nitride, in an exemplary embodiment, the preliminary lower spacer layer 140P and the preliminary upper spacer layer 150P may be formed of substantially the same material including silicon nitride. The thickness $T_{SL}$ of the sacrificial layer SL may be determined according to a target gate length of the V-FinFET of FIG. 1.

Figure 5:
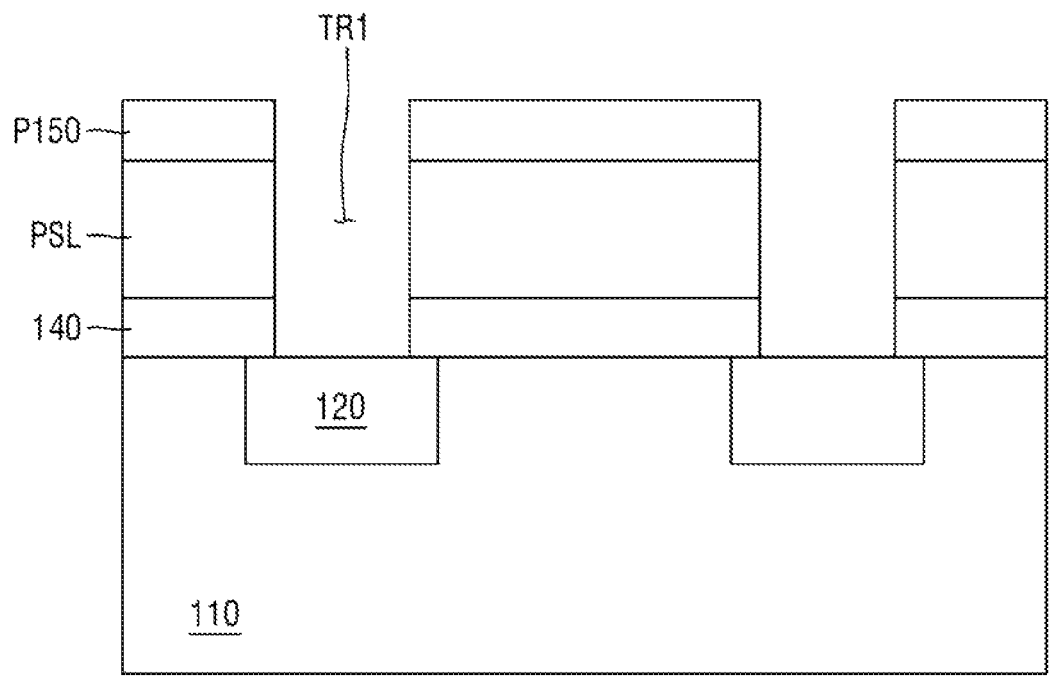

FIG. 5 shows a first trench TR1 formed in the preliminary stacked structure PSS after step 140 of FIG. 2 is performed according to an exemplary embodiment of the present inventive concept.

In step 140, a photolithography process may be performed to define the first trench TR1 in the preliminary stacked structure PSS. For example, a patterned photoresist layer (not shown here) may be formed on the preliminary upper spacer layer 150P of FIG. 4, exposing a region of the preliminary stacked structure PSS to be formed as the first trench TR1.

After the formation of the patterned photoresist layer, a directional etching process may be performed in step 140 to form the first trench TR1 in the preliminary stacked structure PSS. The patterned photoresist layer may be used as an etch mask for the directional etching process. The first trench TR1 penetrates the preliminary stacked structure PSS to expose the lower S/D 120. The first trench TR1 defines a lower spacer 140 from the preliminary lower spacer layer 140P. The first trench TR1 also defines a patterned sacrificial layer PSL from the sacrificial layer SL. A preliminary upper spacer P150 is defined h the first trench TR1. The preliminary upper spacer P150 is further patterned to form the upper spacer 150 of FIG. 1. The formation of the upper spacer 150 will be describe with reference to FIG. 10.

The directional etching process may include a reactive ion etching (RIE) process using fluorine (F)-containing gases such as $CF_4$ as etch gases. For example, the F-containing gases may etch silicon, silicon oxide or silicon nitride.

Figure 6:
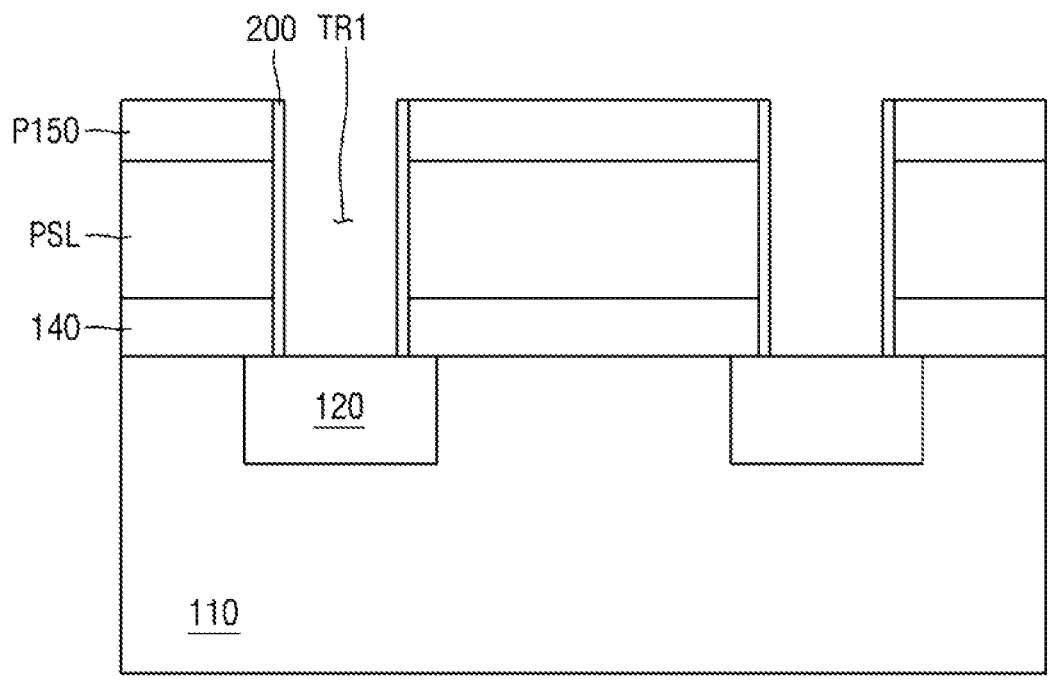

FIG. 6 shows a liner 200 formed after step 150 of FIG. 2 is performed according to an exemplary embodiment of the present inventive concept.

In step 150, a preliminary liner (not shown here) may be conformally formed on the resulting structure of FIG. 5. For example, the preliminary liner may be formed within the first trench TR1 without completely filling the first trench TR1; the preliminary liner may also be formed on an upper surface of the preliminary upper spacer 150.

After formation of the preliminary liner, a directional etching process including an RIE process may be performed on the preliminary liner to form the liner 200. The portions of the preliminary liner formed on the preliminary upper spacer P150 and the lower S/D 120 are removed in the directional etching process and the portion of the preliminary liner formed on the sidewall of the first trench TR1 remains after the directional etching process is performed. The remaining portion of the preliminary liner is referred to as the liner 200. For example, the liner 200 is formed on the sidewall of the first trench TR1.

The preliminary liner may be formed using a chemical vapor deposition (CVD) process, a plasma enhanced CVD (PECVD) process or an atomic layer deposition (ALD) process. The liner 200 may be formed of silicon nitride. For example, the liner 200 may be formed of substantially the same material as the upper and lower spacers 150 and 140.

The liner 200 covers the patterned sacrificial layer PSL to prevent the patterned sacrificial layer PSL from serving as a seed layer for an epitaxial growth process in step 160 of FIG. 2 described below.

Figure 7:
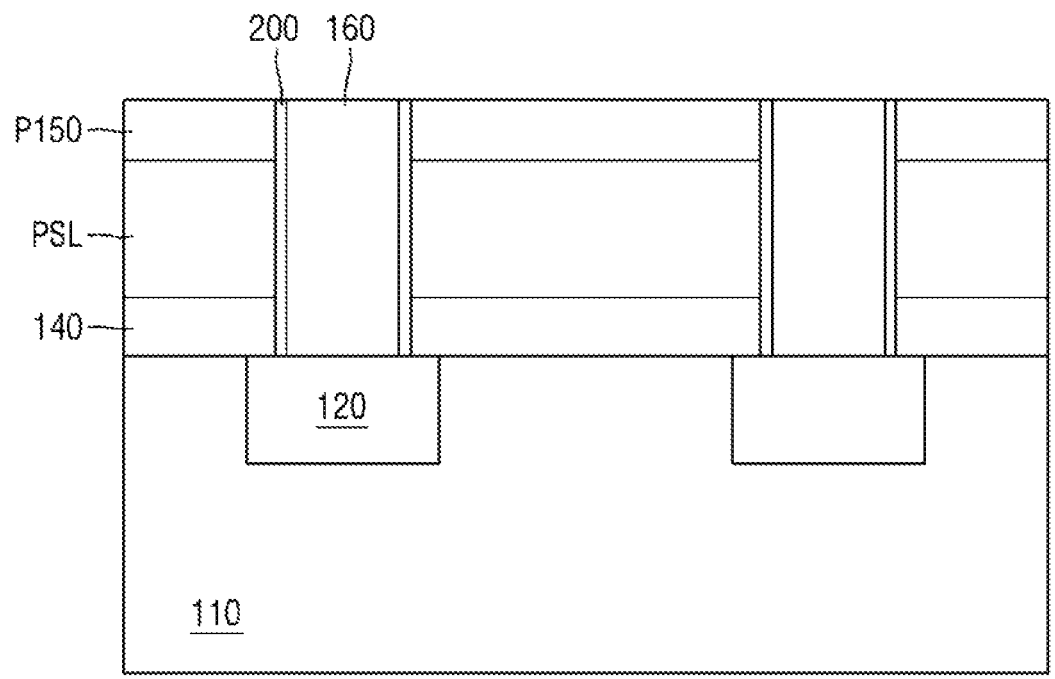

FIG. 7 shows a fin structure 160 formed after step 160 of FIG. 2 is performed according to an exemplary embodiment of the present inventive concept.

In step 160, the fin structure 160 may be epitaxially formed by using the lower S/D 120 as a seed layer. The liner 200 may prevent the fin structure 160 from being epitaxially grown from the patterned sacrificial layer PSL. In an exemplary embodiment, the fin structure 160 may be epitaxially grown from the lower S/D 120. The present inventive concept is not limited thereto. For example, the liner 200 may be omitted and thus the fin structure 160 may be epitaxially grown from the patterned sacrificial layer PSL.

Figure 8:
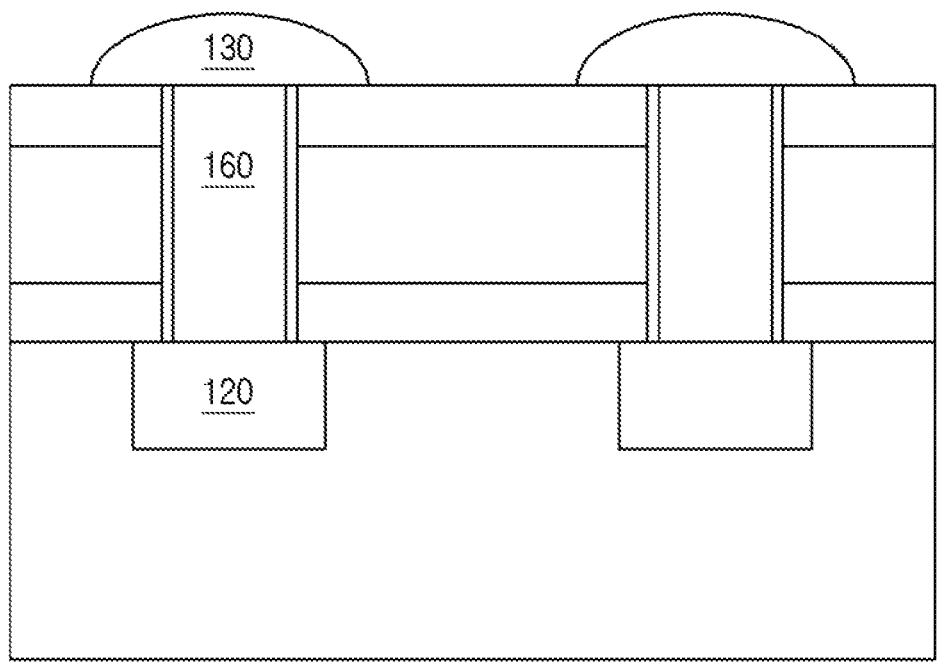

FIG. 8 shows an upper S/D 130 formed after step 170 of FIG. 2 is performed according to an exemplary embodiment of the present inventive concept.

In step 170, the upper S/D 130 may be epitaxially formed from the fin structure 160. In the epitaxial growth of the upper S/D 130, N-type or P-type impurities may be doped. For an N-type transistor, N-type impurities are doped in the epitaxial growth of the upper S/D 130. For a P-type transistor, P-type impurities are doped in the epitaxial growth of the upper S/D 130.

The formation of the fin structure 160 and the formation of the upper S/D 130 may be performed in-situ or continuously. For example, the fin structure 160 and the upper S/D 130 may be continuously formed using an epitaxial growth process. The fin structure 160 and the upper S/D 130 may be formed of silicon or an alloy of silicon and germanium.

Figure 9:
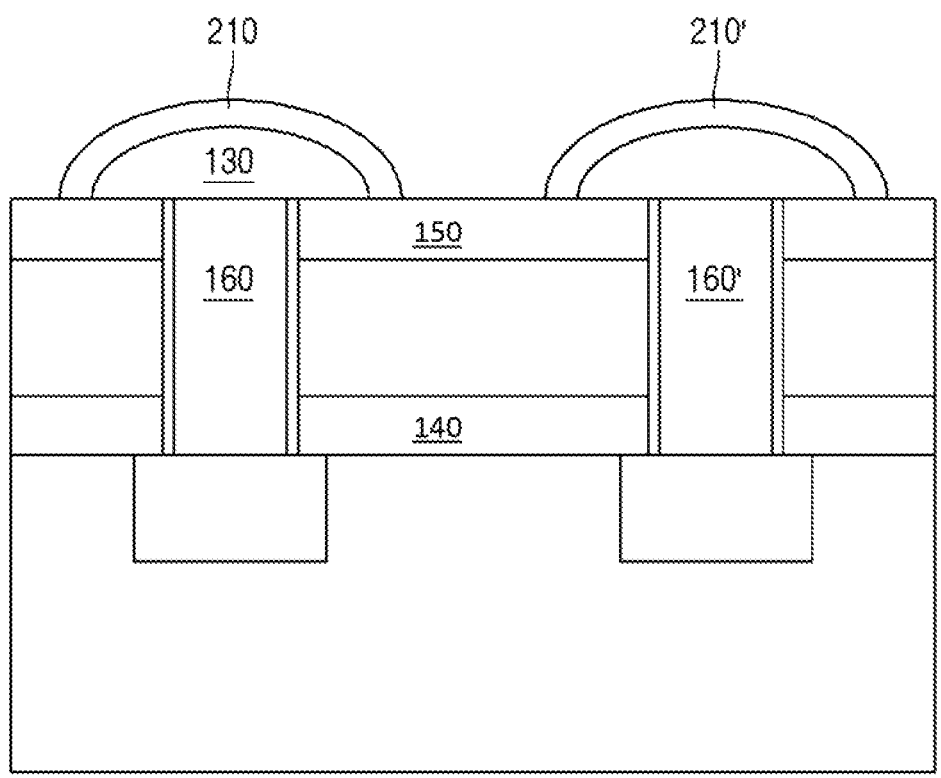

FIG. 9 shows a capping layer 210 formed after step 180 of FIG. 2 is performed according to an exemplary embodiment of the present inventive concept.

Figure 10:
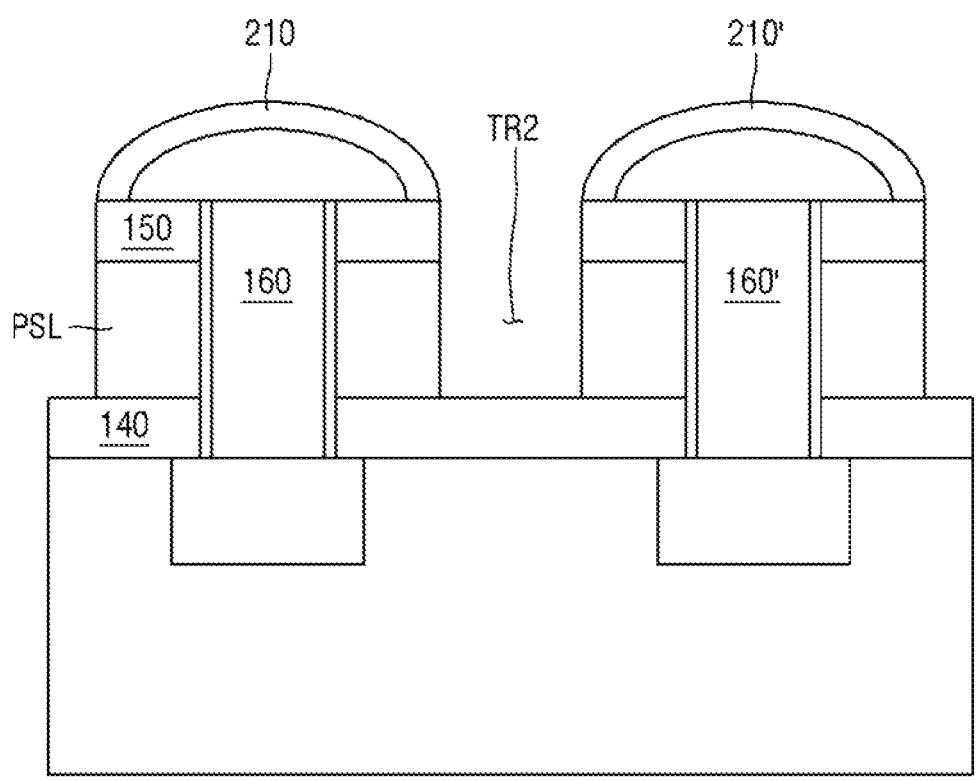

Two adjacent capping layers 210 and 210' may define a region to be formed as a second trench TR2 as shown in FIG. 10 described below. The capping layer 210 is formed on the fin structure 160, covering the upper S/D 130. The other capping layer 210' is formed on another fin structure 160'.

In step 180, a preliminary capping layer (not shown here) may be formed on the resulting structure of FIG. 8 using a CVD process or a PECVD process. The preliminary capping layer may be formed of TiN. After the formation of the preliminary capping layer, a heat treatment may be performed so that the preliminary capping layer reacts with silicon of the upper S/D 130. For example, a silicidation reaction of the preliminary capping layer may occur on the upper S/D 130. The preliminary capping layer on the upper spacer has no silicidation reactions. In an etching process, the preliminary capping layer on the upper spacer is removed and the silicidated preliminary capping layer, which is referred to as a capping layer 210, remain.

FIG. 10 shows a second trench TR2 formed after step 190 of FIG. 2 is performed according to an exemplary embodiment of the present inventive concept.

In step 190, a directional etching process including an RIE process may be performed on the resulting structure of FIG. 9. The capping layers 210 and 210' may serve as an etch mask so that the second trench TR2 is formed between the two adjacent capping layers 210 and 210'. In step 190, the directional etching process may be performed until the lower spacer 140 is exposed through the second trench TR2. The second trench TR2 penetrates the preliminary upper spacer P150 of FIG. 9 to define an upper spacer 150. In an exemplary embodiment, the upper spacer 150 may be formed by the first and second trenches TR1 and TR2. The second trench TR2 further patterns the patterned sacrificial layer PSL so that the patterned sacrificial layer PSL is exposed through the second trench TR2.

Figure 11:
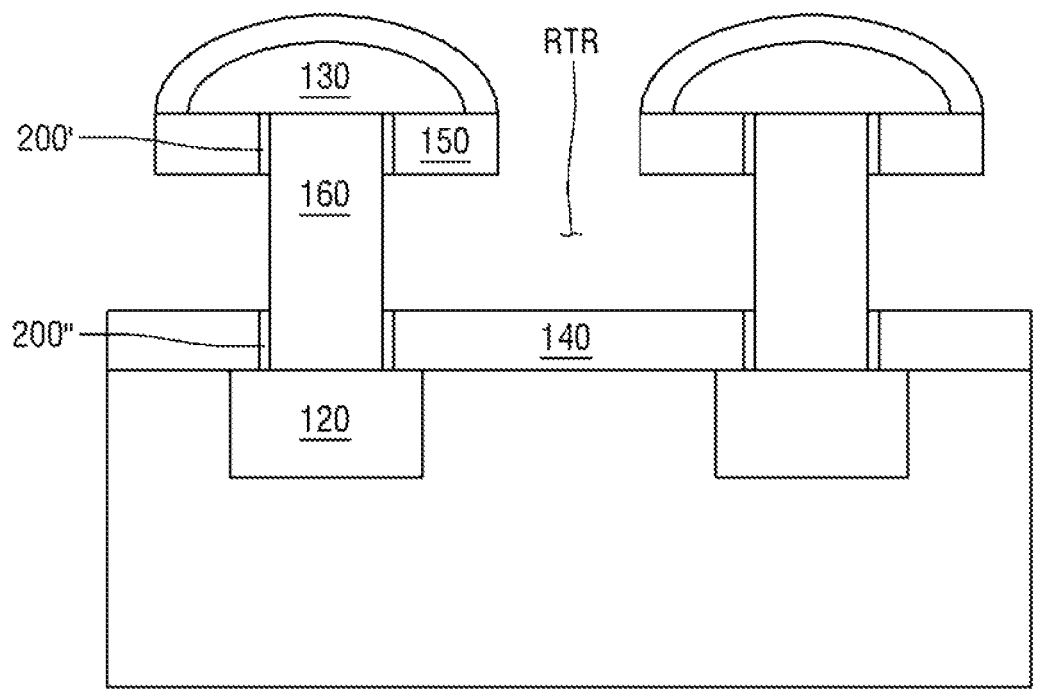

FIG. 11 shows a recessed trench RTR formed after step 200 of FIG. 2 is performed according to an exemplary embodiment of the present inventive concept.

In step 200, the patterned sacrificial layer PSL is removed through the second trench TR2 using an isotropic etching process including a wet etching process or a dry etching process. The liner 200 is also removed in the isotropic etching process of step 200. For example, the second trench TR2 of FIG. 10 is laterally recessed so that the sidewall of the fin structure 160 is exposed through the recessed trench RTR. In this case, the liner 200 interposed between the upper spacer 150 and the fin structure 160 may remain as a first remaining liner 200'; and the liner 200 interposed between the lower spacer 140 and the fin structure 160 may remain as a second remain liner 200".

Figure 11A:
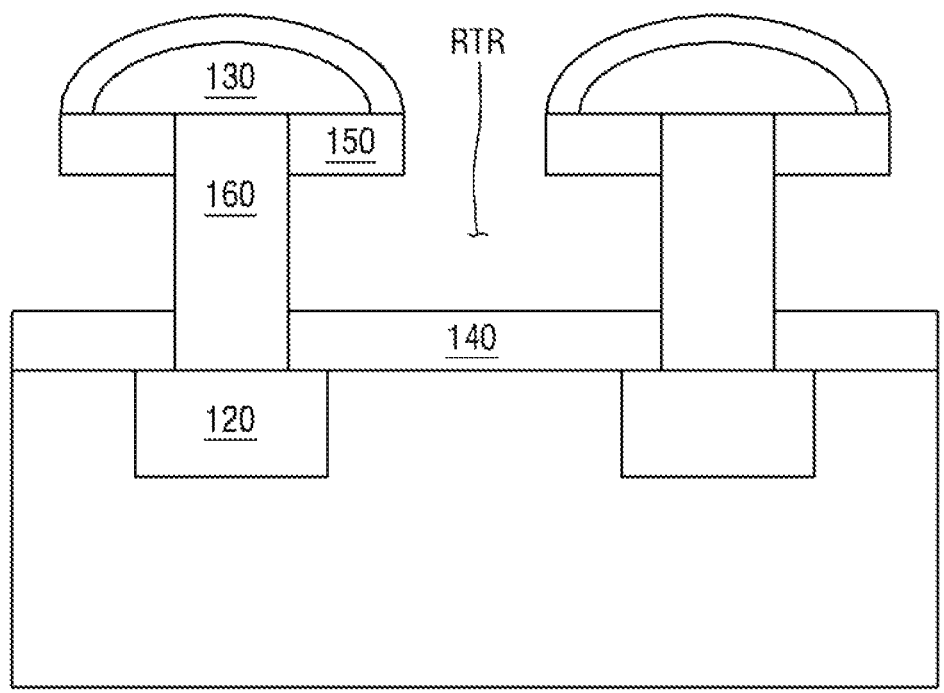
FIG. 11A shows a cross-sectional view of the V-FinFET of FIG. 1 formed according to step 190 of FIG. 2.

In an exemplary embodiment, the liner 200, the lower spacer 140 and the upper spacer 150 may be formed of substantially the same material including silicon nitride. In this case, the first remaining liner 200' and the upper spacer 150 may be seen as a single element having the same material as shown in FIG. 11A. In this case, the first remaining liner 200 may be seen as a part of the upper spacer 150, as shown in FIG. 11A; and the second remaining liner 200 and the lower spacer 140 may be seen as a single element having the same material as shown in FIG. 11A. In this case, the second remaining liner 200" may be seen as a part of the lower spacer 140, as shown in FIG. 11A.

Hereinafter, for the convenience of descriptions, it is assumed that the liner 200, the lower spacer 140 and the tipper spacer 150 are formed of substantially the same material including silicon nitride. Accordingly, the subsequent processes of step 200 may be described with reference to FIG. 11A. The present inventive concept is not limited thereto. For example, the liner 200 may be formed of different materials from materials of the upper and lower spacers 150 and 140. In this case, the subsequent processes of step 200 may be performed on the resulting structure of FIG. 11.

Figure 12:
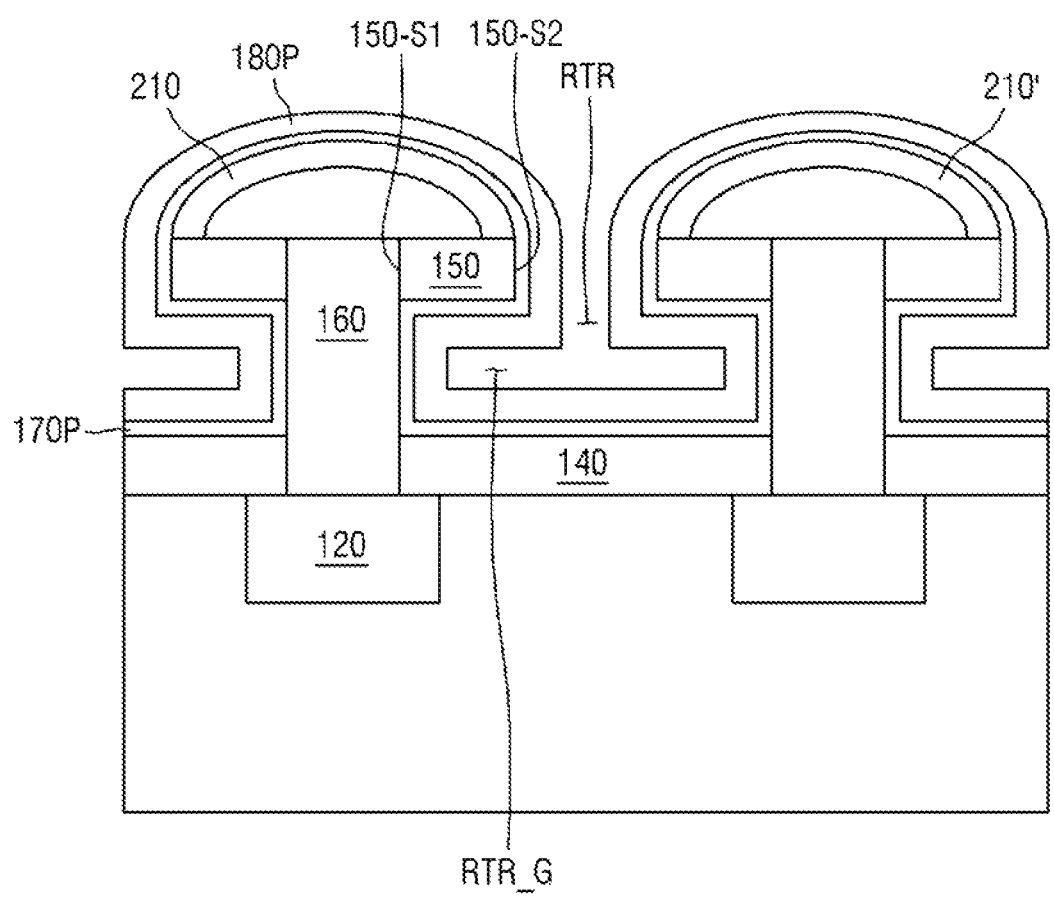

FIG. 12 shows a preliminary gate oxide layer 170P and a preliminary first gate electrode 180P formed after step 210 of FIG. 2 is performed according to an exemplary embodiment of the present inventive concept.

The preliminary gate oxide layer 170P may be conformally formed within the recessed trench RTR using a deposition process including a CVD process, a PECVD process or an MOCVD process.

The preliminary gate oxide layer 170P may have a predetermined thickness to the extent that the recessed trench RTR is not completely filled. For example, the preliminary gate oxide layer 170P is formed on the sidewall of the fin structure 160, a lower surface of the upper spacer 150 and the upper surface of the lower spacer 140. The preliminary gate oxide layer 170P is further formed on a second sidewall 150-S2 of the upper spacer 150. The upper spacer 150 also includes a first sidewall 150-S1 which is in contact with the sidewall of the fin structure 160.

The preliminary gate oxide layer 170P may be formed of a high-k dielectric material including $HfO_2$ or HfSiO.

The preliminary first gate electrode 180P is conformally formed within the recessed trench RTR without completely filling the recessed trench RTR. For example, the preliminary first gate electrode 180P does not completely fill a gap RTR-G of the recessed trench RTR. The gap RTR-G is interposed between the upper spacer 150 and the lower spacer 140.

Figure 12A:
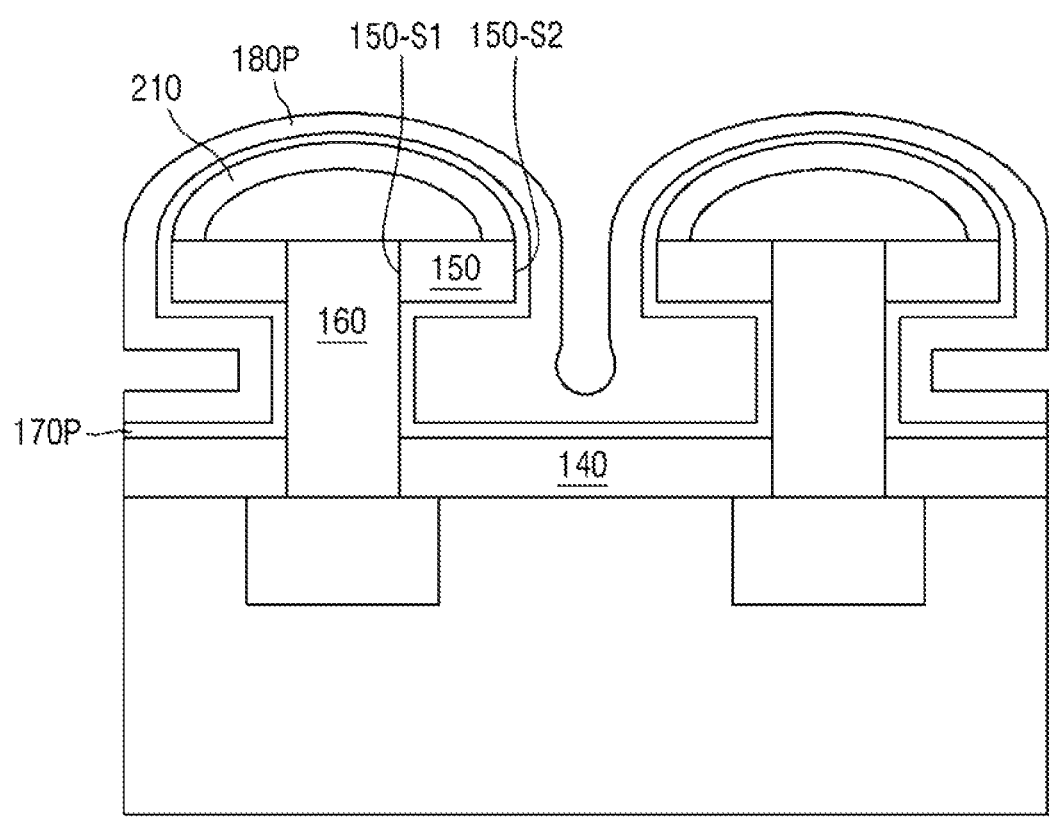
FIGS. 12A and 13A show cross-sectional view of the V-FinFET of FIG. 1A according to the flowchart of FIG. 2.

The present inventive concept is not limited thereto. For example, the preliminary first gate electrode 180P completely fills the gap RTR-G of the recessed trench RTR, as shown in FIG. 12A, without completely filling the recessed trench RTR or the preliminary first gate electrode 180P may completely fill the recessed trench RTR.

The preliminary first gate electrode 180P may be formed using a CVD process. The preliminary first gate electrode 180P may be formed of nitride including TiN. The present inventive concept is not limited thereto. For example, the preliminary first gate electrode 180P may include two or more different material layers such. TiN/TaN/TiAlC.

Figure 13:
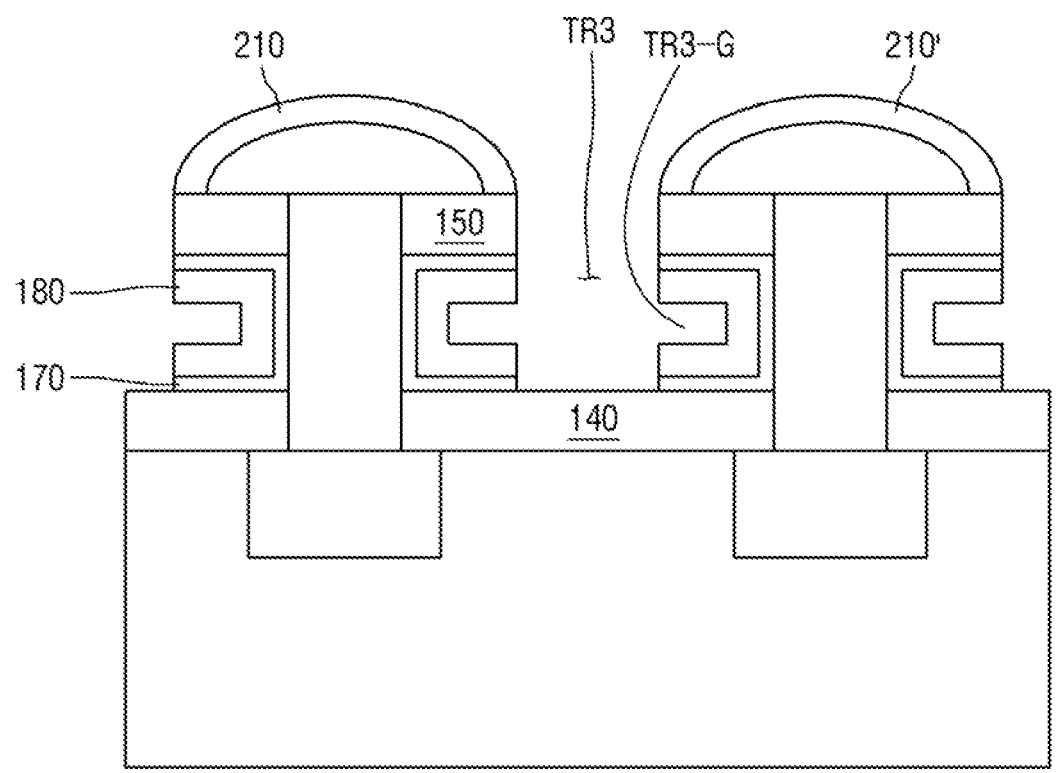

FIG. 13 shows a third trench TR3 formed after step 220 of FIG. 2 is performed according to an exemplary embodiment of the present inventive concept. The step 220 is applied to the resulting structure of FIG. 12.

In step 220, a directional etching process including an RIE process may be performed on the resulting structure of FIG. 12 to form the third trench TR3. With the directional etching process of step 220, the preliminary gate oxide layer 170P and the preliminary first gate electrode 180p are patterned into a gate oxide layer 170 and a first gate electrode 180, respectively. For example, the directional etching process of step 220 may be performed until the upper surface of the lower spacer 140 is exposed through the third trench TR3. In this case, the capping layers 210 and 210' may serve as an etch mask to pattern the preliminary gate oxide layer 170P and the preliminary first gate electrode 180P to the gate oxide layer 170 and the first gate electrode 180, respectively. The gate oxide layer 170 and the first gate electrode 180 are C-shaped so that the C-shaped gate oxide layer 170 and the first gate electrode 180 partially surround a gap TR3-G of the third trench TR3.

The upper spacer 150 may also serve as an etch mask in the directional etching process of step 220.

The gap TR3-G of the third trench is overlapped with the upper and lower spacers 150 and 140.

The preliminary first gate electrode 180P may be etched using $NH_4OH/H_2O_2$. The present inventive concept is not limited thereto. Etch chemistry having etch selectivity of the preliminary first gate electrode 180P with respect to the capping layers 210 and 210' formed of TiN, for example, may be used.

The preliminary gate oxide layer 170P may be etched using etchant gases containing chlorine (Cl) such as $CCl_4$. The present inventive concept is not limited thereto. For example, etchant gases having etch selectivity of the preliminary gate oxide layer 170P with respect to the capping layers 210 and 210'.

Figure 13A:
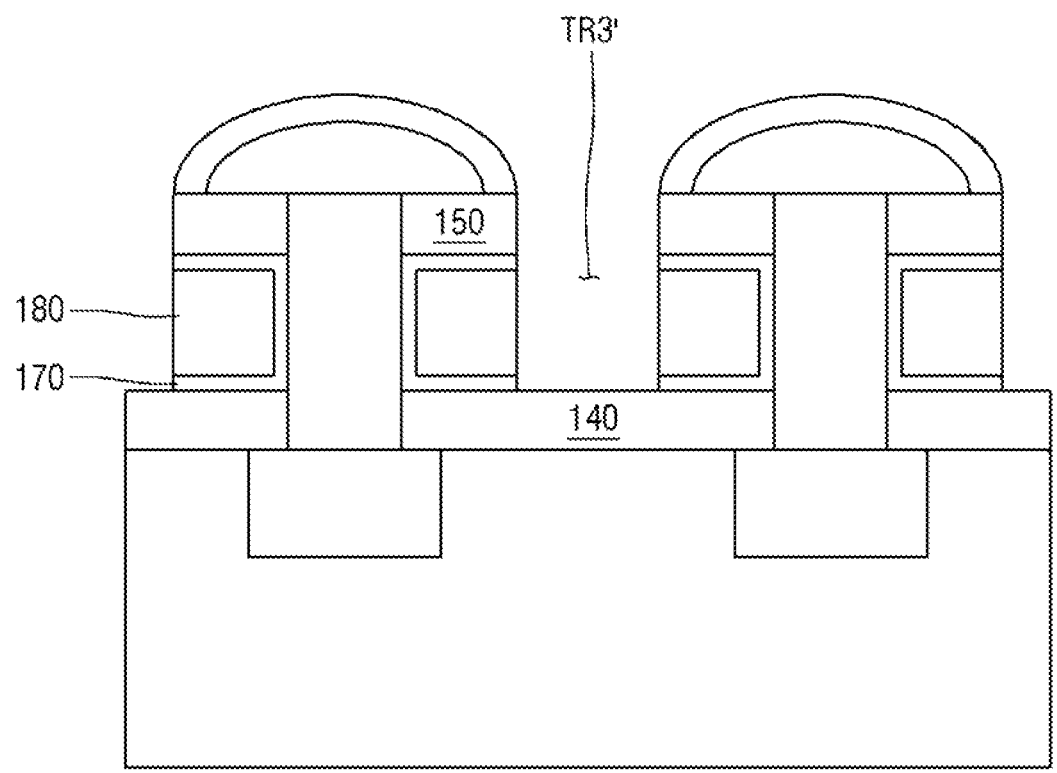

Referring back to FIG. 12A, the step 220 of FIG. 2 may be performed on the resulting structure of FIG. 12A. In this case, FIG. 13A shows a third trench TR3 formed after the step 220 is performed. Unlike the third trench TR3 of FIG. 13, the third trench TR3 of FIG. 13A has no gap TR3-G of FIG. 13.

Figure 14:
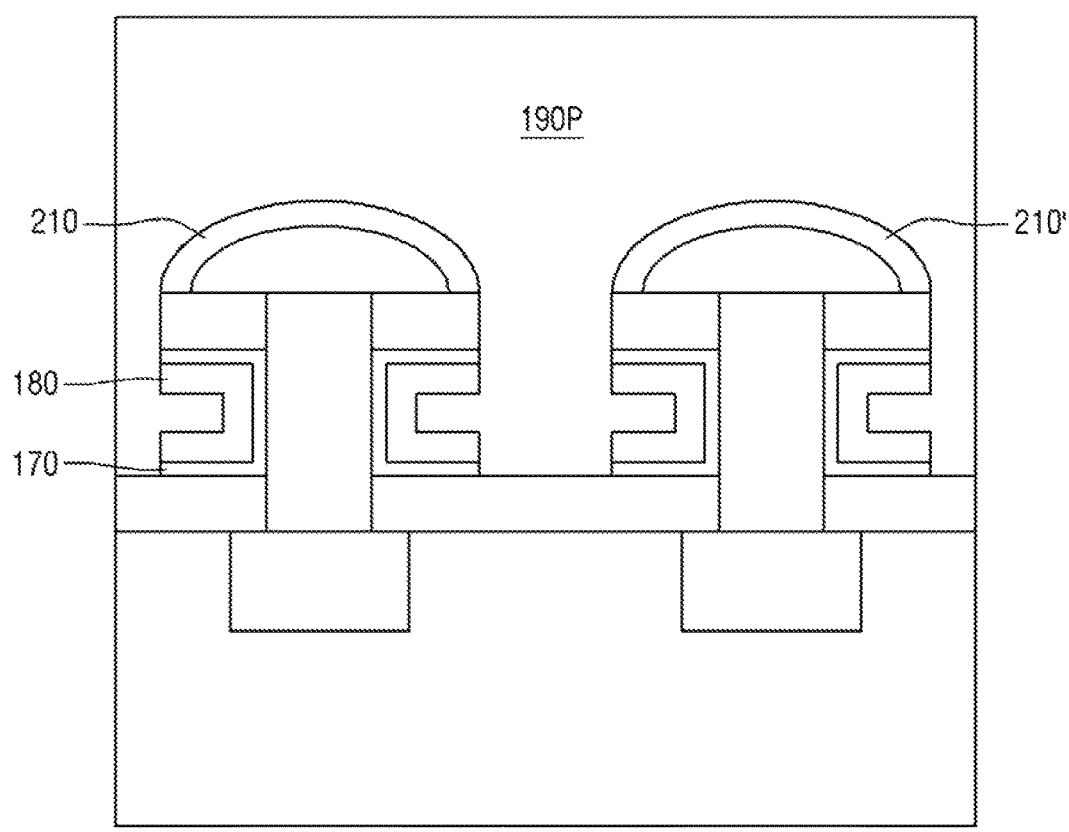

FIG. 14 shows a preliminary second gate electrode layer 190P formed after step 230 of FIG. 2 is performed according to an exemplary embodiment of the present inventive concept.

The preliminary second gate electrode layer 190P is conformally formed within the third trench TR3, filling the third trench TR3 of FIG. 13. The preliminary second gate electrode layer 190P is also formed on the capping layer 210.

A CVD process or an MOCVD process may be performed to form the preliminary second gate electrode layer 190P. The preliminary second gate electrode layer 190P may be formed of a conductive material including tungsten (W) or copper (Cu).

Figure 15:
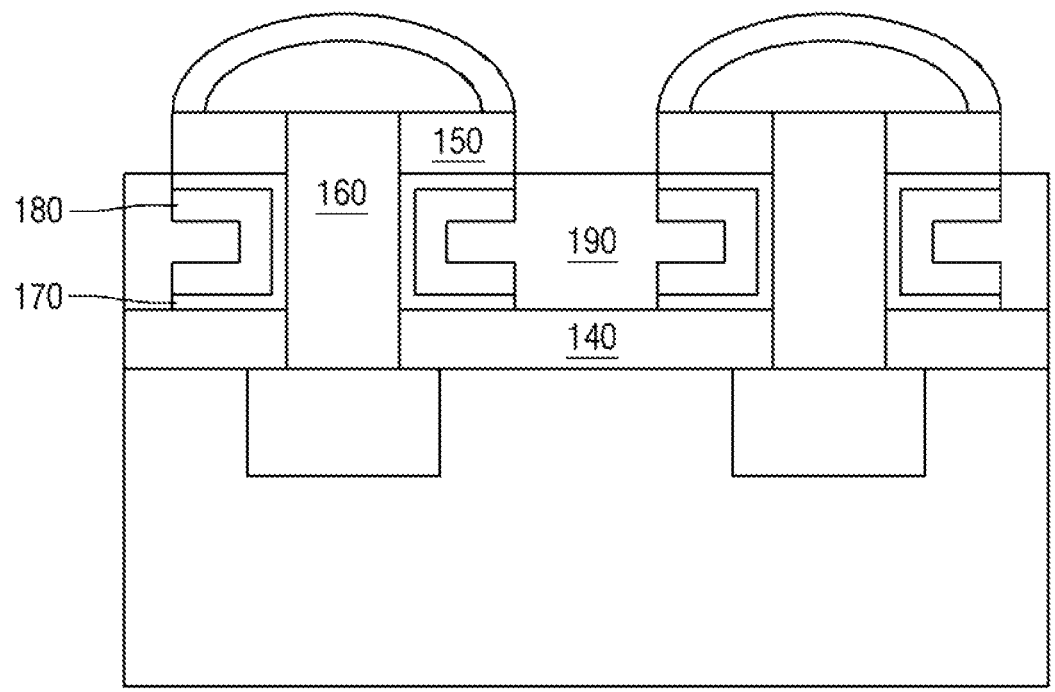

FIG. 15 shows a second gate electrode 190 formed after step 240 of FIG. 2 is performed according to an exemplary embodiment of the present inventive concept.

The preliminary second gate electrode layer 190P of FIG. 14 may be recessed using an etchback process to form the second gate electrode 190. Since the first gate electrode 180 is electrically connected to the second gate electrode 190 and the gate length of the V-FinFET 100A is determined by the height of the fin structure 160 which is capacitively coupled with the first gate electrode 180, the etchback process of step 240 may have a process margin. Depending on a process variation of the etchback process, an upper surface of the second gate electrode 190 may be coplanar with, higher or lower than an interface between the gate oxide layer 170 and the lower surface of the upper spacer 150. For the convenience of descriptions, FIG. 15 shows the second gate electrode 190 of which the upper surface is coplanar with the interface between the gate oxide layer 170 and the lower surface of the upper spacer 150.

Figure 16:
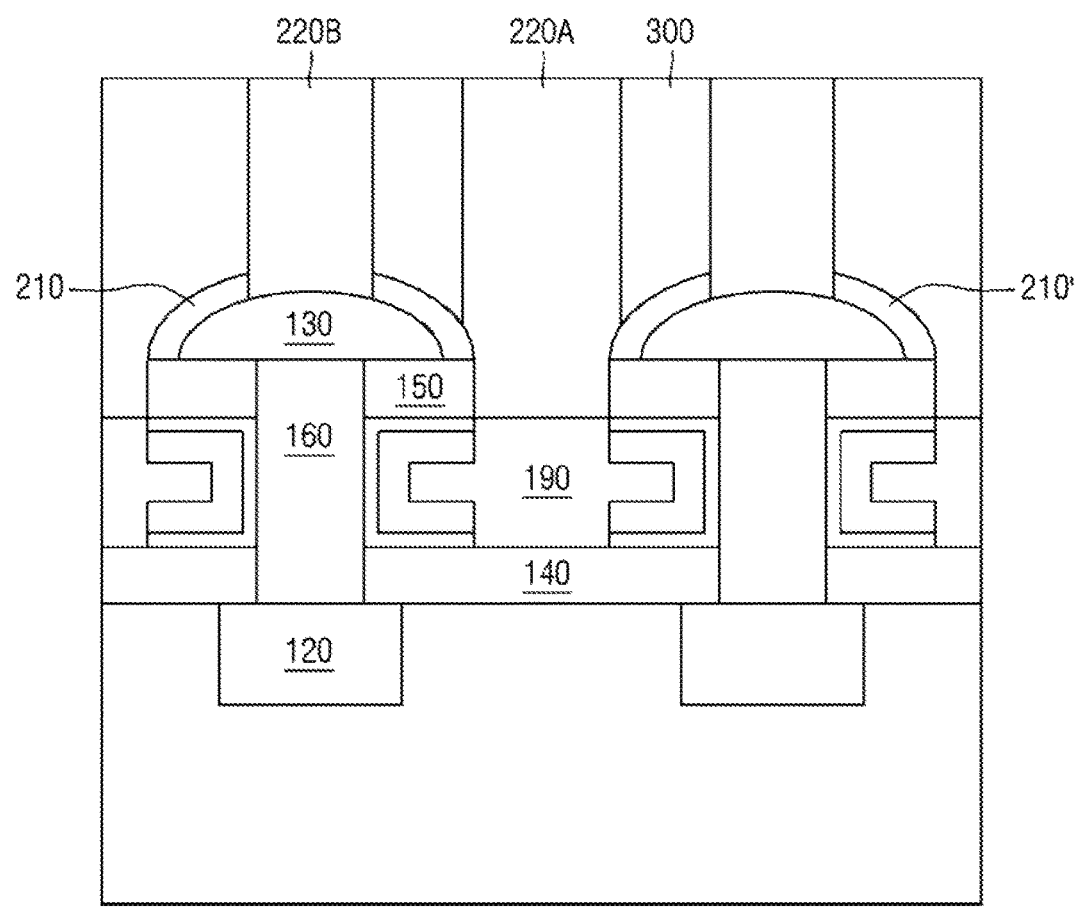

FIG. 16 shows contact electrodes 220A and 220B formed after step 250 of FIG. 2 is performed according to an exemplary embodiment of the present inventive concept.

In step 250, an insulating layer 300 is formed on the resulting structure of FIG. 15. For example, the insulating layer 300 is formed on the capping layer 210 and the second gate electrode 190. The contact electrodes 220A and 220B penetrate the insulating layer 300. For example, the gate contact electrode 220A penetrates the insulating layer 300 to be electrically connected to the second gate electrode 190; and the upper S/D contact electrode 220B penetrates the insulating layer 300 and the capping layer 210 to be electrically connected to the upper S/D 130. The gate contact electrode 220A may be self-aligned with the second gate electrode 190 using the capping layers 210 and 210'.

An ohmic contact layer (not shown here) may be interposed between the gate contact electrode 220A and the second gate electrode 190 and between the upper S/D contact electrode 220B and the upper S/D 130.

A lower S/D contact electrode (not shown here) may penetrate the insulating layer 300 and the lower spacer 140 to be electrically connected to the lower S/D 120. An ohmic contact layer (not show here) may be interposed between the lower S/D 120 and the lower S/D contact electrode. When viewed from the above, the lower spacer 140 may surround the fin structure 160. Accordingly, the lower S/D contact electrode may penetrate the lower spacer 140 to be electrically connected to the lower S/D 120.

According to an exemplary embodiment of the present inventive concept, a preliminary stacked structure of a preliminary lower spacer layer, a sacrificial layer and a preliminary upper spacer layer may be formed before a fin structure is formed so that a target gate length of a V-FinFET is determined by the thickness of the sacrificial layer.

The steps 230 to 250 applied to the resulting structure of FIG. 13 may be applicable to the resulting structure of FIG. 13A to form a semiconductor device 100' of FIG. 1A. The repeated descriptions with respect to the steps 230 to 250 are omitted herein for the convenience of descriptions.

Figure 17:
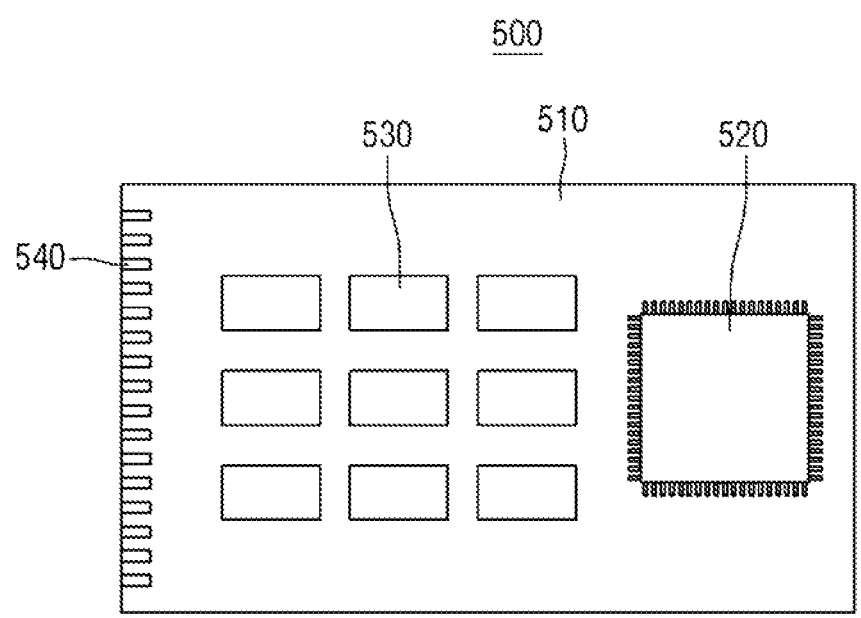
FIG. 17 is a semiconductor module having a V-FinFET fabricated according to an exemplary embodiment of the present inventive concept.

FIG. 17 is a semiconductor module having a semiconductor device fabricated according to an exemplary embodiment of the present inventive concept.

Referring to FIG. 17, the semiconductor module 500 includes a semiconductor device 530. The semiconductor device 530 may be formed according to an exemplary embodiment of the present inventive concept. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD).

Figure 18:
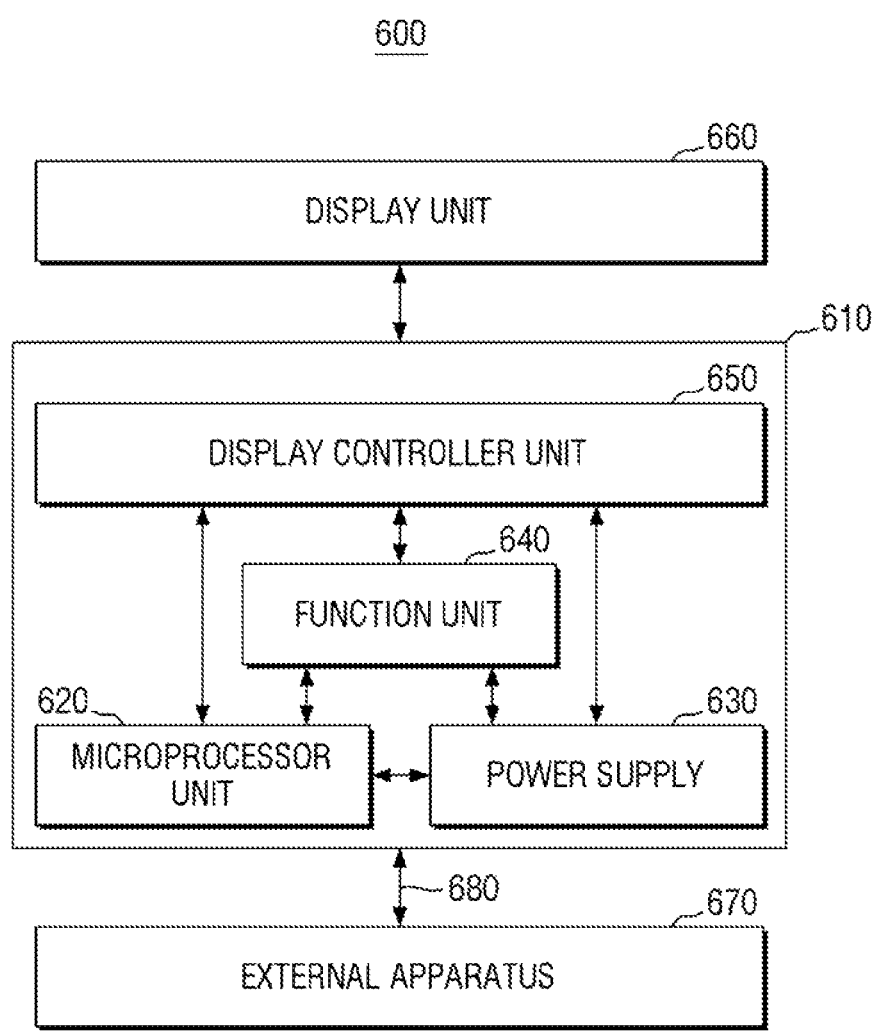
FIG. 18 is a block diagram of an electronic system having a V-FinFET according to an exemplary embodiment of the present inventive concept.

FIG. 18 is a block diagram of an electronic system having a semiconductor device according to an exemplary embodiment of the present inventive concept.

Referring to FIG. 18, a semiconductor device fabricated according to an exemplary embodiment of the present inventive concept may be included in an electronic system 600. The electronic system 600 includes a body 610, a microprocessor unit 620, a power supply 630, a function unit 640, and a display controller unit 650. The body 610 may include a system board or a motherboard having a printed circuit board (PCB) or the like. The microprocessor unit 620, the power supply 630, the function unit 640, and the display controller unit 650 are mounted or disposed on the body 610. A display unit 660 may be stacked on an upper surface of the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. In an exemplary embodiment, if the electronic system 600 is connected to a memory card to expand the storage capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a semiconductor device fabricated according to an exemplary embodiment of the present inventive concept.

Figure 19:
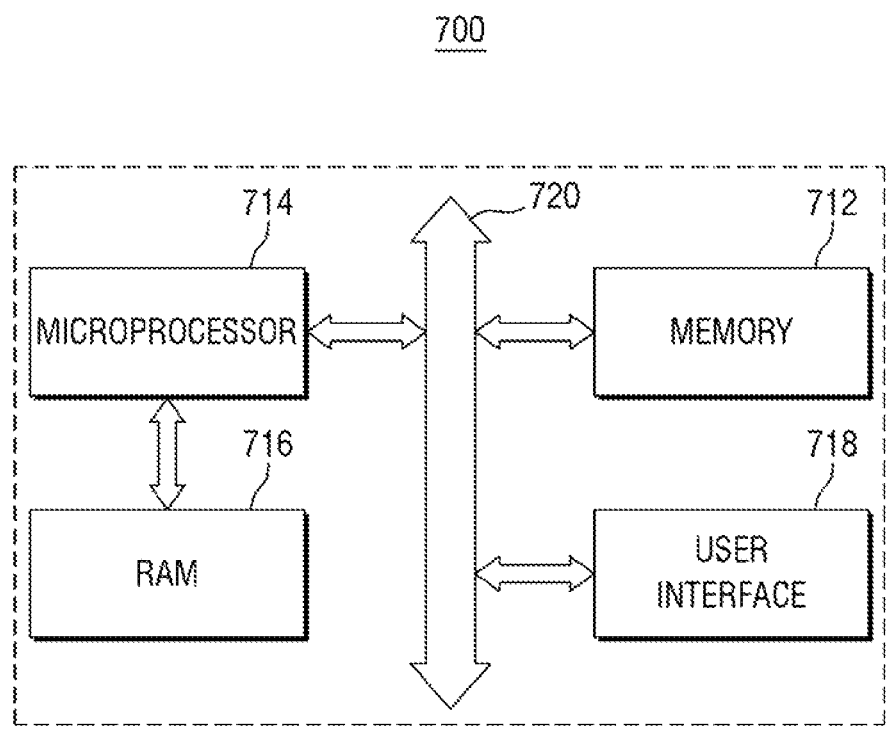
FIG. 19 is a block diagram of an electronic system having a V-FinFET fabricated according to an exemplary embodiment of the present inventive concept.

FIG. 19 is a block diagram of an electronic system having a semiconductor device fabricated according to an exemplary embodiment of the present inventive concept.

Referring to FIG. 19, the electronic system 700 may be included in a mobile device or a computer. For example, the electronic system 700 includes a memory system 712, a microprocessor 714, a random access memory (RAM) 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the ail that various changes in form and detail may be made therein without departing from the spirit and scope of the inventive concept as defined by the following claims.

What is claimed is:

1. A method of fabricating a vertical fin field effect transistor (V-FinFET), comprising:
   forming a lower source/drain (S/D) in a substrate;
   forming a preliminary stacked structure on the substrate, the preliminary stacked structure including a preliminary lower spacer layer, a sacrificial layer and a preliminary upper spacer layer stacked on each other;

forming a first trench penetrating the preliminary stacked structure to expose the lower S/D;

forming a fin structure in the first trench and on the lower S/D;

forming an upper S/D on the fin structure and the preliminary stacked structure;

forming a capping layer on the fin structure covering the upper S/D;

forming a second trench penetrating the preliminary upper spacer layer and the sacrificial layer;

removing the sacrificial layer exposed through the second trench so that a sidewall of the fin structure is exposed;

forming a preliminary gate oxide layer within the second trench;

forming a preliminary gate electrode on the preliminary gate oxide layer within the second trench; and patterning the preliminary gate oxide layer and the preliminary gate electrode using the capping layer as a mask so that a gate oxide layer and a first gate electrode are formed, respectively, and wherein the fin structure is epitaxially grown from the lower S/D.

2. The method of claim 1, wherein the forming of the preliminary stacked structure includes:

forming a preliminary lower spacer layer on the substrate;

forming a sacrificial layer on the preliminary lower spacer layer; and forming a preliminary upper spacer layer on the sacrificial layer, wherein the sacrificial layer is interposed between the preliminary lower spacer layer and the preliminary upper spacer layer.

3. The method of claim 2, wherein the sacrificial layer is formed of a different material from materials of the preliminary lower spacer layer and the preliminary upper spacer layer.

4. The method of claim 3, wherein the sacrificial layer is formed of silicon or silicon oxide, and wherein the preliminary lower spacer layer and the preliminary upper spacer layer are formed of silicon nitride.

5. The method of claim 1, wherein the first gate electrode includes TiN, TaN or TiAlC.

6. The method of claim 1, further comprising:

forming a second gate electrode on the first gate electrode; and forming a gate contact electrode on the second gate electrode, wherein the capping layer aligns the second gate electrode and the gate contact electrode.

7. The method of claim 1, wherein the gate oxide layer includes a C-shaped portion.

* * * * *